US011392559B2

(12) United States Patent
Bentley et al.

(10) Patent No.: US 11,392,559 B2
(45) Date of Patent: Jul. 19, 2022

(54) TECHNIQUES FOR ALIGNMENT OF SOURCE INFRASTRUCTURE DATA WITH A BIS CONCEPTUAL SCHEMA

(71) Applicant: Bentley Systems, Incorporated, Exton, PA (US)

(72) Inventors: Keith A. Bentley, Elverson, PA (US); Casey Mullen, Downingtown, PA (US); Samuel W. Wilson, Downingtown, PA (US)

(73) Assignee: Bentley Systems, Incorporated, Exton, PA (US)

( * ) Notice: Subject to any disclaimer, the term of this patent is extended or adjusted under 35 U.S.C. 154(b) by 673 days.

(21) Appl. No.: 16/156,887

(22) Filed: Oct. 10, 2018

(65) Prior Publication Data

US 2019/0108245 A1    Apr. 11, 2019

Related U.S. Application Data

(60) Provisional application No. 62/570,294, filed on Oct. 10, 2017.

(51) Int. Cl.
*G06F 16/21* (2019.01)
*G06F 16/27* (2019.01)
(Continued)

(52) U.S. Cl.
CPC ........ *G06F 16/212* (2019.01); *G06F 16/2282* (2019.01); *G06F 16/248* (2019.01);
(Continued)

(58) Field of Classification Search
CPC .... G06F 16/212; G06F 16/27; G06F 16/2282; G06F 16/256; G06F 16/24565; G06F 16/248; G06F 30/00
See application file for complete search history.

(56) References Cited

U.S. PATENT DOCUMENTS 6,173,289 B1 *   1/2001   Sonderegger ........... G06F 9/445
6,704,747 B1     3/2004   Fong
(Continued)

OTHER PUBLICATIONS

"Notification of Transmittal of the International Search Report and the Written Opinion of the International Searching Authority, or the Declaration," International Filing Date: Oct. 10, 2018, International Application No. PCT/US2018/055250, Applicant: Bentley Systems, Incorporated, dated Dec. 7, 2018, pp. 1-12.

*Primary Examiner* — William B Partridge
*Assistant Examiner* — Lahcen Ennaji
(74) *Attorney, Agent, or Firm* — Cesari and McKenna, LLP; James A. Blanchette

(57) ABSTRACT

In one embodiment, techniques are provided for aligning source infrastructure data to be compatible with a conceptual schema (e.g., BIS) implemented through an underlying database schema (e.g., DgnDb). Data aligned according to the conceptual schema may serve as a "digital twin" of real-world infrastructure usable throughout various phases of an infrastructure project, with physical information serving as a "backbone", and non-physical information maintained relative thereto, forming a cohesive whole, while avoiding unwanted data redundancies. Source-format-specific bridge software processes may be provided that that know how to read and interpret source data of a respective source format, and express it in terms of the conceptual schema. The aligned data may be sent to an update agent that interprets the aligned data and computes a changeset therefrom, which may be stored for eventual application to a particular instance of a database maintained according to an underlying database schema of the conceptual schema.

20 Claims, 4 Drawing Sheets

(51) Int. Cl.
*G06F 16/248* (2019.01)
*G06F 16/22* (2019.01)
*G06F 16/2455* (2019.01)
*G06F 16/25* (2019.01)
*G06F 30/00* (2020.01)

(52) U.S. Cl.
CPC ...... *G06F 16/24565* (2019.01); *G06F 16/256* (2019.01); *G06F 16/27* (2019.01); *G06F 30/00* (2020.01)

(56) References Cited

U.S. PATENT DOCUMENTS

| | | | |
|---|---|---|---|
| 8,631,048 B1 * | 1/2014 | Davis | G06F 16/211 |
| | | | 707/803 |
| 10,353,916 B2 | 7/2019 | Bentley et al. | |
| 10,503,603 B2 | 12/2019 | Wilson | |
| 2004/0034651 A1 | 2/2004 | Gupta et al. | |
| 2004/0230619 A1 * | 11/2004 | Blanco | G06F 16/27 |
| 2005/0262182 A1 * | 11/2005 | Thole | G06F 9/466 |
| | | | 709/200 |
| 2011/0295575 A1 * | 12/2011 | Levine | G06Q 30/02 |
| | | | 703/2 |
| 2013/0304724 A1 * | 11/2013 | Rosjat | G06F 16/2455 |
| | | | 707/722 |
| 2019/0079958 A1 | 3/2019 | Bentley et al. | |
| 2019/0081847 A1 | 3/2019 | Bentley et al. | |
| 2020/0387498 A1 * | 12/2020 | Sundelin | G06F 16/219 |

\* cited by examiner

TECHNIQUES FOR ALIGNMENT OF SOURCE INFRASTRUCTURE DATA WITH A BIS CONCEPTUAL SCHEMA

CROSS-REFERENCE TO RELATED APPLICATIONS

The present application claims the benefit of U.S. Provisional Patent Application Ser. No. 62/570,294, which was filed on Oct. 10, 2017, by Keith A. Bentley et al. for TECHNIQUES FOR ALIGNMENT OF SOURCE INFRASTRUCTURE DATA WITH A BIS CONCEPTUAL SCHEMA, which is hereby incorporated by reference.

BACKGROUND

Technical Field

The present disclosure relates generally to infrastructure modeling, and more specifically to techniques for alignment of source infrastructure data to be compatible with a conceptual schema.

Background Information

Throughout the design, construction and operation of infrastructure (e.g., buildings, factories, roads, railways, bridges, electrical and communication networks, etc.) it is often desirable to model the infrastructure using infrastructure modeling applications. Such infrastructure modeling applications often use a variety of different technologies and data formats to maintain infrastructure descriptions, used in different phases of an infrastructure project. Typically, infrastructure information maintained according to such formats is disjointed, and includes substantial data redundancies, inconsistencies, and other sources of inefficiency. Models may be optimized and adapted for particular use cases, generally without regard for other phases of the infrastructure project, leading to distinct product/discipline/phase data silos and disconnected workflows.

There is a need for techniques that can break down such existing product/disciple/phase data silos and enable the generation of a true "digital twin" of real-world infrastructure that describes the aspects of infrastructure in a more unified manner. However, even if a unified digital description of real-world infrastructure can be developed, it is impractical to expect industry to abandon the investment made in software that uses existing disjoint technologies and data formats. Techniques are needed to allow a unified digital description to be utilized together in workflows with existing applications, and their diverse collection of disjoint technologies and data formats.

While a variety of converters exist (or may developed) to translate data stored in one format (according to one technology) to another format (according to a different technology), conventional converters are unsuited for this challenge. A conventional converter may allow another application to read infrastructure data authored by a first application, but typically does not allow the application to understand the converted infrastructure data, or combine its own data with the converted data meaningfully, since the meaning of the data authored by the first application is often only implicit in the authoring program, and is not expressed in the storage format. Such a conversion does not provide "alignment", where the meaning of the source data is accurately expressed in the new data format, to permit meaningful use. This hinders the use of the source data, and may lead to significant inefficiencies.

What is needed are techniques for alignment of source infrastructure data to be compatible with a unified digital description that serves as a "digital twin" of real-world infrastructure throughout various phases of an infrastructure project.

SUMMARY

Techniques are provided for aligning source infrastructure data to be compatible with a conceptual schema (e.g., built infrastructure schema (BIS)) implemented through an underlying database schema (e.g., DgnDb). Data aligned according to the conceptual schema may serve as a "digital twin" of real-world infrastructure usable throughout various phases of an infrastructure project, with physical information serving as a "backbone", and non-physical information (e.g., analytical information, functional information, informational information, etc.) maintained relative thereto, forming a cohesive whole, while avoiding unwanted data redundancies. Source-format-specific bridge software processes may be provided that know how to read and interpret source data of a respective source format and express it in terms of the conceptual schema. The aligned data may be sent to an update agent that interprets the aligned data and computes a changeset therefrom, which may be stored for eventual application to a particular instance of a database maintained according to an underlying database schema of the conceptual schema.

In one specific embodiment, source infrastructure data is aligned to be compatible with a conceptual schema that provides a unified digital description of real-world infrastructure using source-format-specific bridge software processes. A source-format-specific bridge software process detects changes to source data of an infrastructure description in one or more external databases or source files since a last alignment, and, in response to detecting the changes, reads at least the changed source data. The bridge software process aligns the changed source data with the conceptual schema to produce a description compliant with the conceptual schema. The alignment may use one or more schema mappings, and involve operations such as generating elements, models and aspects that express the changed source data, choosing types of elements and models that classify the changed source data as associated with modeling perspectives, generating role elements that describe usage of the changed source data, creating relationships that related elements, models and aspects for the changed source data, transforming spatial data from a source coordinate system into a spatial coordinate system used by the conceptual schema, and/or transforming unit labels from a source unit system into a unit system used by the conceptual schema. An update agent then computes a changeset. Infrastructure modeling hub services store the changeset for eventual application to a particular instance of a database maintained according to an underlying database schema of the conceptual schema to update an infrastructure description therein. Database entries from the particular instance of the database may be used by a client, for example, to display a visualization of the updated infrastructure description or analyze the updated infrastructure description as part of the design, construction and/or operation phase of an infrastructure project.

It should be understood that a variety of additional features and alternative embodiments may be implemented other than those discussed in this Summary. This Summary is intended simply as a brief introduction to the reader and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Definitions

Figure 1:
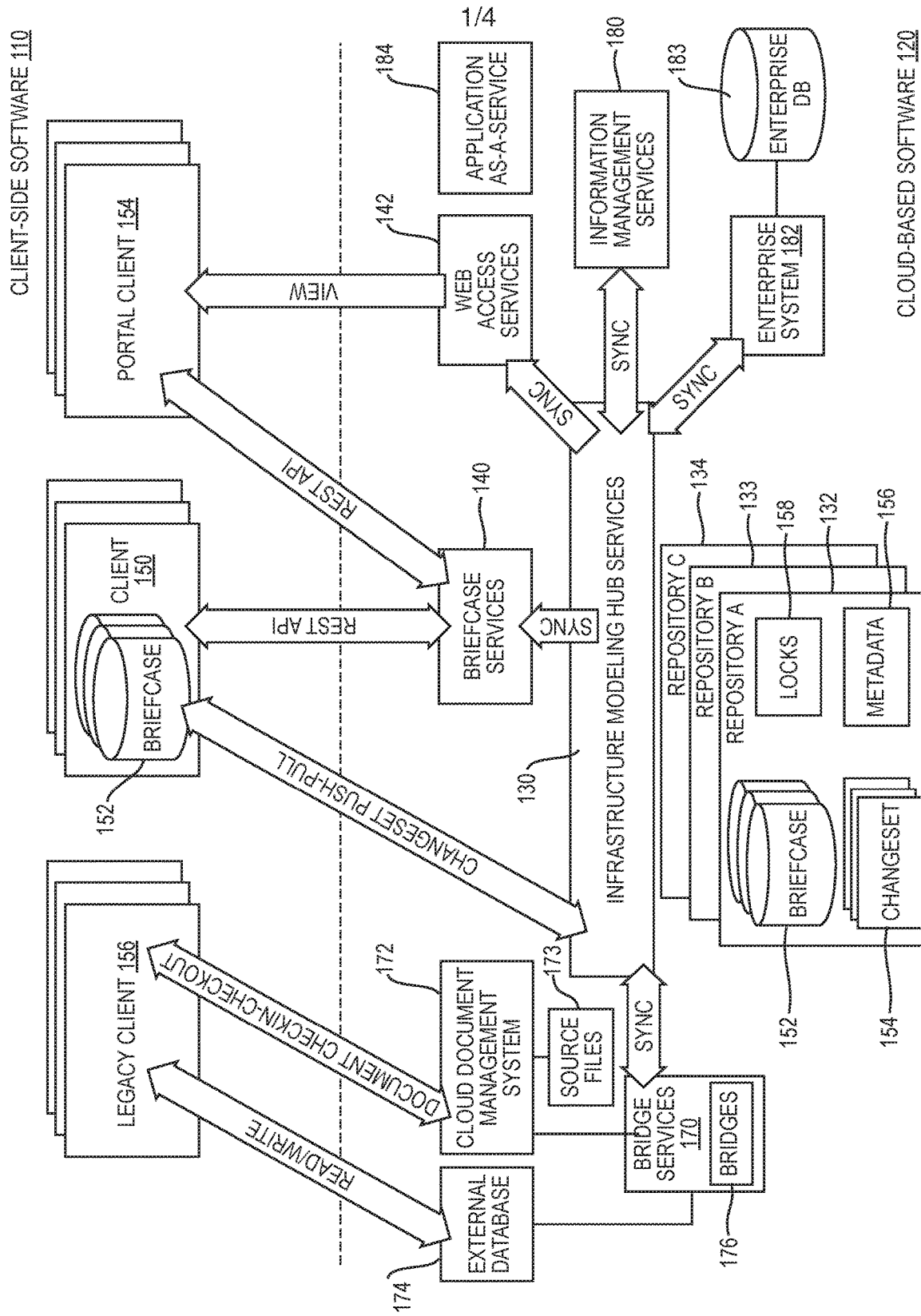
FIG. 1 is a high-level block diagram of at least a portion of an example infrastructure modeling software architecture.

As used herein, the term "infrastructure" refers to a physical structure or object that has been built, or is planned to be built, in the real-world. Examples of infrastructure include buildings, factories, roads, railways, pipe networks, etc.

As used herein, the terms "built infrastructure schema" or "BIS" refer to a type of conceptual schema (i.e. a conceptual data model) that describes the semantics of data representing infrastructure. BIS may be implemented using an underlying database (e.g., a SQLite database), with structures in BIS mapped to an underlying database schema (e.g., DgnDb) of the database.

As used herein, the term "infrastructure modeling repository", or simply "repository", refers to a distributed database. Each constituent database of the distributed database may be referred to as a "briefcase," as discussed below.

As used herein, the term "changeset" refers to a persistent electronic artifact that captures changes needed to transform a particular briefcase from one valid state to a new valid state. A changeset may be generated by recording changes made to the briefcase as they happen. A changeset that captures the changes needed to move the briefcase from one state (e.g., a state M) to another state (e.g., a state N) may be applied (in sequential order) to a copy of the briefcase at state M to update it to state N. The changeset may also be applied "in reverse" to transform a briefcase in state N back to state M.

As used herein, the term "briefcase" refers to a particular instance of a database (e.g., a SQLite database) that implements BIS. When a briefcase is used as a constituent database of a repository, the briefcase represents a materialized view of the information of a specific version of the repository. The repository in a state (e.g., a state M) is defined as the information resulting from sequentially applying all changesets up to and including changeset M to a "baseline" briefcase, for example an empty "baseline" briefcase. A briefcase holding version M of the repository can be updated to another version (e.g., a version Q) of the repository by applying to it the set of changesets from N to Q, inclusive.

As used herein, the term "element" refers to a record maintained in a briefcase. The element represents (i.e. "models", in a colloquial sense of the term) an entity in the real-world (e.g., pumps, beams, contracts, companies etc.). An element that represents an infrastructure entity in the real-world (e.g., a pipe, pump, beam, support, etc.) is referred to herein as an "infrastructure element."

As used herein, the term "aspect" refers to a set of properties that belong to a particular element, but which have an independent lifecycle (e.g., may come and go over the lifetime of an element). In one embodiment, individual aspects may be owned by individual elements, but are not individually identifiable and do not have incoming relationships other than from the element that owns it.

As used herein, the term "model" refers to a container for a set of elements maintained in a briefcase where the set of elements collectively represent (i.e. "model", in a colloquial sense of the term) an entity in the real-world. The entity in the real-world may be an individual unit of infrastructure. In one embodiment, models may nest. That is, a model is said to "break down" a particular element (e.g., an infrastructure element) into a finer-grained description (i.e. a description that describes the same entity in the real-world but at a fine granularity).

As used herein, the term "relationship" refers to a connection that relates two or more elements, aspects or models. Examples of relationships include parent-child relationships that may imply ownership and peer-peer relationships that may define groups.

Example Embodiments

FIG. 1 is a high-level block diagram of at least a portion of an example infrastructure modeling software architecture. The architecture may be divided into client-side software 110 executing on one more or more computing devices arranged locally on-premises or hosted for an enterprise's use (collectively "client devices"), and cloud-based services software 120 that is executed on one or more remote computing devices ("cloud computing devices") accessible to the enterprise, and other enterprises, over the Internet.

At the core of the cloud-based services software 120 are infrastructure modeling hub services (e.g., iModelHub services) 130 that provide centralized management and synchronization support, and that work closely with briefcase services 140 that provide clash detection, validation, costing, publishing, analytics, among other services. Infrastructure modeling hub services (e.g., iModelHub services) 130 maintain repositories 132-134 that include briefcases 152, a set of accepted changesets (e.g., historical changesets) 154, metadata 156 (e.g., that includes storage locations, lookup identifiers, sequence information, etc. about the changesets), and locks 158 (e.g., that may provide pessimistic locking per element and per model). A briefcase 152 in a repository 132-134 may begin as an empty "baseline" briefcase that is programmatically generated and that may be persisted by infrastructure modeling hub services (e.g., iModelHub services) 130. A repository 132-134 may be modified by accepting new changesets into the sets of accepted changesets 154. A changeset may be created by change-detection functionality that records the actual and specific effects of modifications made to a briefcase. A new changeset may only be accepted as a modification of the repository (i.e. into the set of accepted changesets 154) if it holds changes relative to a briefcase that is of the most recent version of the repository's information. As the number of changesets in the set of accepted changesets 154 grows, the time required to take an empty "baseline" briefcase and apply all changesets needed to transform it into a briefcase at a specific version (e.g., the "most recent version") may grow large. For this reason, infrastructure modeling hub services (e.g., iModelHub services) 130 may create additional "snapshot" briefcases 152 at different versions. When a specific version (e.g., the "most recent version") of a briefcase is needed, the briefcase 152 closest to such version (which may be a "snapshot" briefcase) is accessed and changesets (or reverse changesets) from the set 154 are applied until a briefcase 152 of the needed version is obtained.

Clients 150 may be executed locally on desktop or mobile computing devices of an enterprise or hosted for the enterprise's use. Each client 150 may utilize a Hypertext Transfer Protocol (HTTP)-based representational state transfer (REST) application program interface (API) to communicate with infrastructure modeling hub services (e.g., iModelHub services) 130 to obtain a local briefcase and changesets needed to transform it into a briefcase of a desired version of the repository 132-134. Clients 150 may subscribe to notification functions provided by infrastructure modeling hub services (e.g., iModelHub services) 130 to receive notifications regarding new changesets in the repository's set of accepted changesets 154. The clients 150 may then "pull" (download) the new changeset(s) and apply them to its briefcase to update it to the new version. Similar operations may occur when a client 150 modifies a briefcase, to propagate those changes. When a client modifies a version of a briefcase (e.g., version X), resulting in a modified briefcase with a provisional new version number (e.g., a provisional new version Y), a new provisional changeset (e.g., a provisional changeset Y) is generated from the modifications. The provisional changeset Y is then "pushed" (uploaded) to modeling hub services (e.g., iModelHub services) 130. If changeset X is still the most recent changeset that has been accepted into the repository's set of accepted changesets 154, then the provisional changeset Y is accepted into the set of accepted changesets 154 and becomes the new "most recent changeset" Otherwise, the client 152 may "pull" (download) any newer changeset(s) and apply them to its briefcase and reconcile any inconsistencies created by that update. After this "pull and merge" process is complete, the client 152 may attempt to "push" (upload) an updated provisional changeset to infrastructure modeling hub services (e.g., iModelHub services) 130.

In addition to this operation, infrastructure modeling hub services (e.g., iModelHub services) 130 may receive calls from other services and support additional functions. For example, web access services 142 may call infrastructure modeling hub services (e.g., iModelHub services) 130 as part of providing live or published views of infrastructure maintained in a briefcase 152 to certain practitioner applications operating as portal clients 154. Portal clients 154 may be web based, executed locally on desktop or mobile computing devices or hosted, communicating with the briefcase services 140 and infrastructure modeling hub services (e.g., iModelHub services) 130 via a HTTP-based REST API. Such portal clients 154 generally do not maintain a local briefcase, but instead rely upon connectivity to the web access services 142. Information services 180 manage asset data, project data, reality data, Internet of Things (IoT) data, codes, and other features. An enterprise system 182 manages an on-site or hosted enterprise database 183 storing enterprise-specific data. Further, an application-as-a-service platform 184 provides insights, deliverables management, package management, as well as a variety of other services.

Certain external applications (referred to generally as "legacy clients") 156 may rely on different technologies and data formats to maintain infrastructure descriptions. Such formats may include a number of long-utilized database and file formats, such as DGN, DWG, RVT, IFC, etc. Legacy clients 156 may make changes to data by checking-out, modifying, and then checking-back-in files 173 with a document management system 172, or reading and then writing-back different database entries to an external debase 174. To support such legacy clients 156, the bridge services 170 may work together with infrastructure modeling infrastructure modeling hub services (e.g., iModelHub services) 130 to incrementally align data (i.e. "source data") in source files 173 managed by the document management system 172 and/or in the external database 174 from the source formats to be compatible with the conceptual schema (e.g., BIS). To that end, that bridge services 170 include a number of source-format-specific bridge software processes 176 that each know how to read and interpret source data of a respective source format, and express it in terms of the conceptual schema (e.g., BIS). As explained in more detail below, the bridge software processes 176 may be responsively executed upon detection of changes in the source data, executing independently, and potentially in parallel.

The conceptual schema (e.g., BIS) provides a way of describing all facets of infrastructure in various (e.g., all) phases of an infrastructure project, from design, to construction and operation, in a unified manner. In this way, the conceptual schema may be a "digital twin" of real-world infrastructure, operating as a cohesive whole, while avoiding unwanted data redundancies (i.e. overlapping information). Physical information may server as a "backbone" of the "digital twin", and non-physical information (e.g., analytical information, functional information, informational information etc.) may be maintained relative to (e.g., augmenting) the "backbone". The structure and meaning of data maintained according to the conceptual schema (e.g., BIS) may be explicit in the data itself. A wide variety of different modeling, analysis and visualization software programs may be able to read and understand data maintained according to the conceptual schema and create new data according to it. As such, the conceptual schema may address problems related to combining and interpreting data written using various vendor-specific, discipline-specific or industry-specific technologies and data formats, breaking down walls between what traditionally have been separate data "silos".

Figure 2:
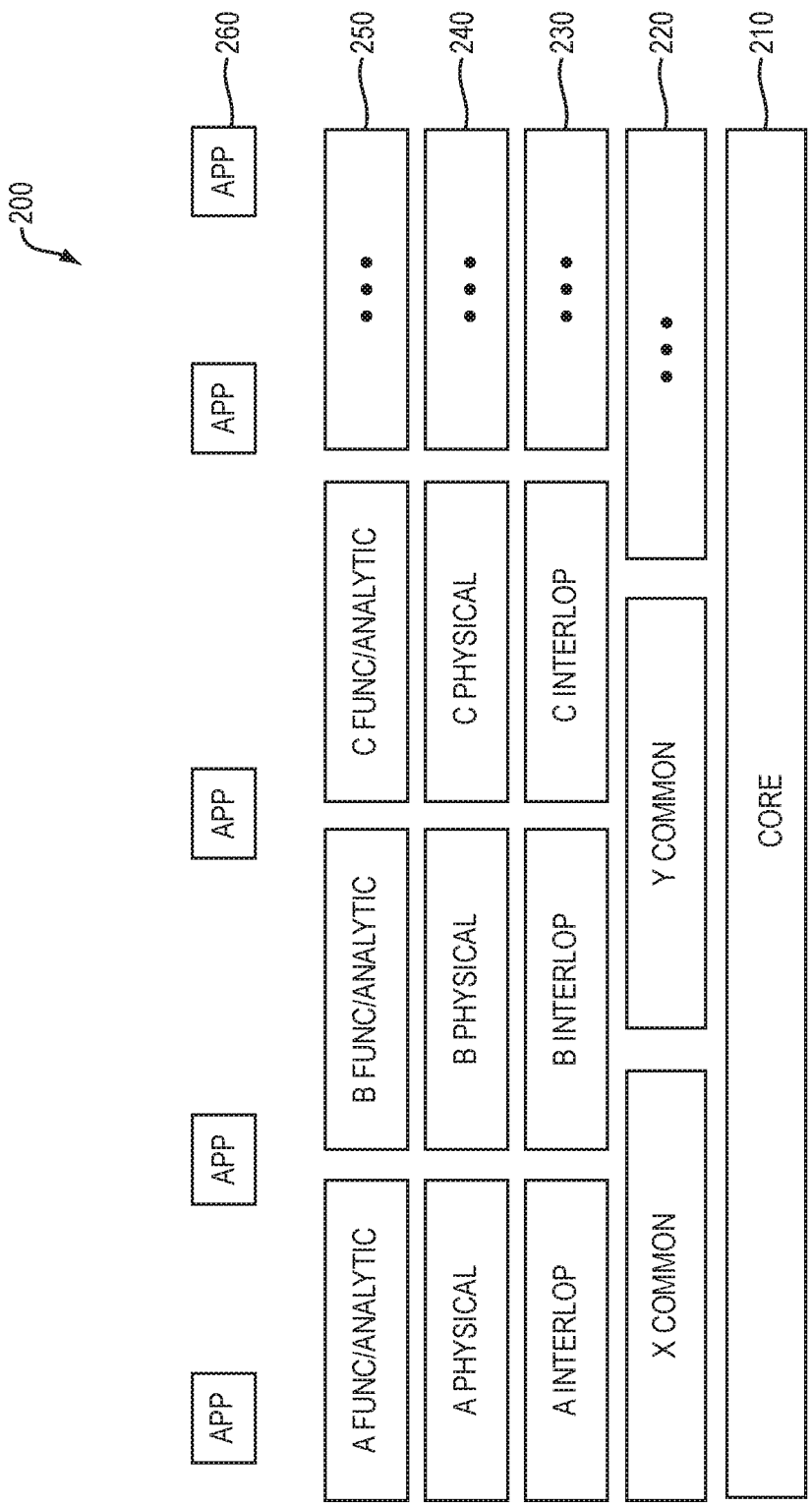
FIG. 2 is a block diagram illustrating example hierarchically layered domains of a conceptual schema.

The conceptual schema (e.g., BIS) may be structured as a family of hierarchically layered domains. Each domain defines classes and data types for a naturally coherent and limited set of subject matter, which may have a clear scope and owner. The domains may be hierarchically layered based on how generic or specialized the subject matter is. FIG. 2 is a block diagram 200 illustrating example hierarchically layered domains of a conceptual schema (e.g., BIS). At the lowest layer (a "core" layer), a single core domain may define core classes and organizational strategies that all other domains must follow. At a next layer above the core layer (a "common" layer) 220, common domains may define data types and organizational strategies applicable to multiple engineering disciplines. An example of a common domain may be a "Building" common domain that includes classes and organizational strategies related to building qualities such as stories, but not lower level details of architecture (such as windows) or structure (such as beams). At a further layer above the common layer (an "interop" layer) 230, interop domains may define data types and organizational strategies applicable to interoperability among engineering disciplines. An example interop domain may describe electrical properties, such as load, that may allow other disciplines to define required electrical service (e.g., for pumps, elevators, server rooms, etc.). At a still further layer above the interop layer (a "physical" layer) 240, physical domains may define data types and organizational strategies applicable to real-world physical entities. At yet an even higher layer above the physical layer (a "functional/analytical" layer) 250, functional/analytical domains may define data types and organizational strategies for functional or analytical data used to enable schematics and simulations. At a final layer above the functional/analytical layer (an "application" layer 260), small application domains may define a limited number of data types for access by specific application software.

The conceptual schema (e.g., BIS) describes a fabric composed of elements, aspects, models and relationships used to store all infrastructure information. The finest-grained record that can be individually identified and locked is the element, which represents (i.e. "models", in a colloquial sense of the term) an entity in the real-world. Elements may not be inherently geometric, and may, in some cases, contain no geometric information. In one embodiment, three types of elements may be defined from which all other elements may descend: the geometric element, the information element, and the role element.

A geometric element may represent any entity in the real-world as inherently being geometric (such that it can be called upon to be graphically displayed), and may include physical entities (e.g., pumps, beams, etc.) as well as drawing graphics (e.g., lines arcs, circles, etc.) in geometric context. A geometric element may be hierarchically defined according to a 2D branch, for example, including 2D geometric, 2D graphical, and drawing graphic classes; and a 3D branch, for example, including 3D geometric, 3D graphical, spatial, physical, and spatial location classes.

An information element may be a carrier of information of some real-world information entity. An example of an information element is a "requirement" element that carries information about a requirement (e.g., flow rate, bearing capacity, etc.) of a physical entity (e.g., a pump, beam, etc.). An information element may be hierarchically defined according to a definition branch, for example, including graphical 2D type and physical type classes, and a document branch, for example, including a drawing class.

A role element may represent the usage of a physical entity in different domains, and allow common information to be shared and leveraged. Role elements may be linked to other role elements through physical elements. For example, consider a piece of gold that may play many roles simultaneously in different systems (e.g., it can act as a thermal conductor, a store of financial value, a work of art, etc.). All of those "roles" may be expressed by role elements connected through a physical element that represents the physical piece of gold.

Elements may be hierarchically organized through a series of parent-child relationships that imply ownership and cascading deletes (e.g., when the parent is deleted so too are its children). Typically, an element may have a maximum of one parent, but may have multiple children. An element this is the parent may be considered an assembly of all its children. All elements in a parent-child hierarchy typically reside in the same model. Since there can be multiple levels in the hierarchy, there can be assemblies of assemblies.

An aspect of the conceptual schema (e.g., BIS) describes a set of properties that belong to a particular element, but which have an independent lifecycle (e.g., may come and go over the lifetime of an element). An aspect is typically not individually identifiable and lacks incoming relationships other then from the single element that owns it. In one embodiment, two types of aspects may be defined: the element unique aspect, and the element multi aspect. An element unique aspect may be a class for when there are zero or one aspect owned by an individual element, and the element multi aspect be a class for when there are zero, one or more aspects owned by an individual element, A model of the conceptual schema (e.g., BIS) is a container for a set of elements where the set of elements collectively represent (i.e. "model", in a colloquial sense of the term) an entity in the real-world. The model owns elements that it contains and provides context for the elements. Each element is contained in a single model. Every model represents (i.e. "models", in a colloquial sense of the term) some element (that is not contained in that model), with the exception of a repository model, as discussed in more detail below.

Models may be arranged according to a model hierarchy to support modeling from multiple perspectives (including multiple granularities). A single "repository model" that models a high level entity may serve as a root of the model hierarchy. The repository model includes one or more subjects that may be organized hierarchically. A single root subject (i.e. a subject that has no parent) is included that describes what the repository model is about. The repository model may also include one or more child subjects (i.e. a subject that has another subject as a parent), which name portions of the entity named by the "root subject" or entities closely related to entities named by the "root subject." Each subject (either the root subject or a child subject) has one or more information partitions associated with it using parent-child relationships. Each information partition represents a particular modeling perspective that indicate the facets of the subject to be modeled, e.g., physical, functional, or some other role. A physical information partition represents a physical modeling perspective; an analytical information partition represents an analytical modeling perspective; an informational information partition represents an informational modeling perspective, etc. One or more child models are associated with each information partition. Each child model contains one or more elements that represent the entity named in the subject using the modeling perspective that is indicated by the information of which the model is a child. A physical information partition can be a child of a subject, and a physical model that is a child of the partition may represent the physical attributes of the entity named by the subject. An analytical model may represents an analytical information and contain elements that express analytical data regarding performance under certain conditions or other properties (e.g., structural integrity, thermal performance, etc.). Similarly, an informational model may represent informational information and contain elements that express related information such as procurable components or design specifications. It should be understood that a wide variety of additional information partitions and models may be provided.

A relationship of the conceptual schema (e.g., BIS) is a connection that relates two or more elements, aspects or models. Examples of relationships include parent-child relationships that imply ownership and peer-to-peer relationships that define groups. In one embodiment, two classes of relationships may be provided, with abstract relationships prohibiting instantiations but permitting inheritance therefrom, and sealed relationships prohibiting inheritance therefrom. Inheriting relationships may narrow the relationship, by providing equal or more-specific sources and targets and/or equal or more-restrictive cardinalities.

Figure 3:
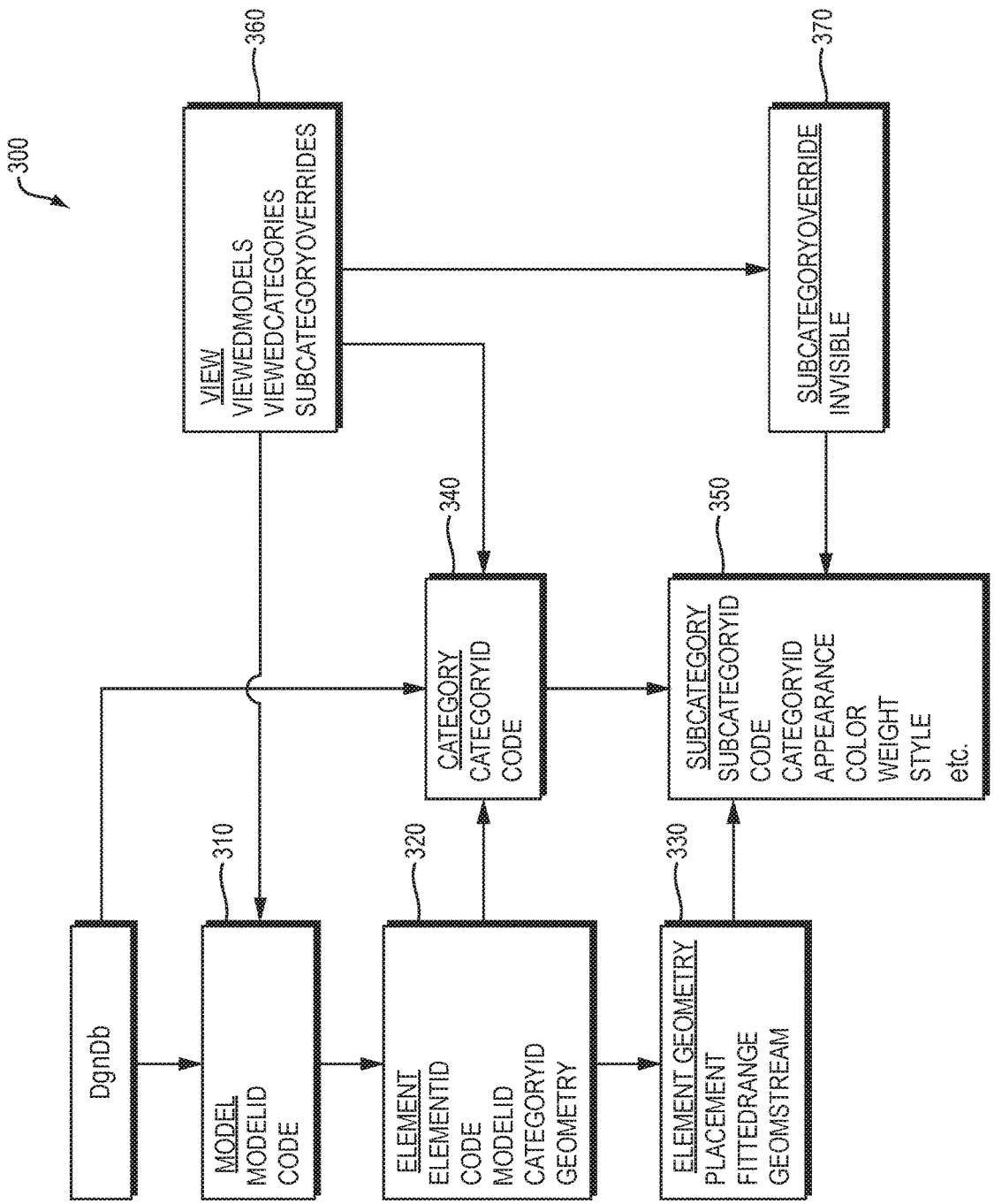
FIG. 3 is a portion of an example database schema (e.g., DgnDb)

As discussed above, the conceptual schema (e.g., BIS) may be implemented through an underlying database schema (e.g., DgnDb). The underlying database schema may specify individual tables and columns and rows of tables (e.g., SQLite tables) used by briefcases 152. FIG. 3 is a portion of an example database schema (e.g., DgnDb) 300. In the database schema 300, rows of a model table 310 represent models. Model table columns may include a model ID and a code column. An element table 320 may include rows that represent elements. Element table columns may include an element ID column, a code column, a model ID column (e.g., referencing a row of the model table 310), a category ID column (e.g., referencing a row of the category table 340), and a geometry column (e.g., referencing a row of an element geometry table 330). Rows of the element geometry table 330 may represent geometry aspects of the referencing element. Columns of the element geometry table 330 may include placement columns, size columns, and a geometry stream. Element geometry table rows may reference one or more rows of a subcategory table 350. Rows of the category table 340 may represent categories. Columns of the category table 340 may include an element ID column, and a code column. Rows of the subcategory table 350 may represent subcategories. Columns of the subcategory table 350 may include a subcategory ID column, a code column, a category ID column (referencing a row of the category table 340), and appearance columns, such as a color column, a weight column, a style column. Further, rows of a view table 360 may represent graphical views. Columns of the view table 360 may include a viewed models column (e.g., referencing one or more rows of the model table 320), a viewed categories column (e.g., referencing one or more rows of the category table 340), and a subcategory override column (e.g., by referencing one or more rows of a subcategory override table 370). It should be understood that the database schema (e.g., DgnDb) may also include a number of additional and/or different tables, columns and rows used to implement the conceptual schema (e.g., BIS).

As mentioned above, to support legacy clients 156, bridge software processes 176 of the bridge services 170 may work together with infrastructure modeling infrastructure modeling hub services (e.g., iModelHub services) 130 to align the source data to conform to the conceptual schema (e.g., BIS). Such alignment may not only re-express the source data to conform it to the conceptual schema, but also a specific domain thereof that defines classes and data types for a naturally coherent and limited set of subject matter. The net effect of such alignment is to translate the source data into a form that can be meaningfully used within the cohesive "digital twin" of real-world infrastructure.

Figure 4:
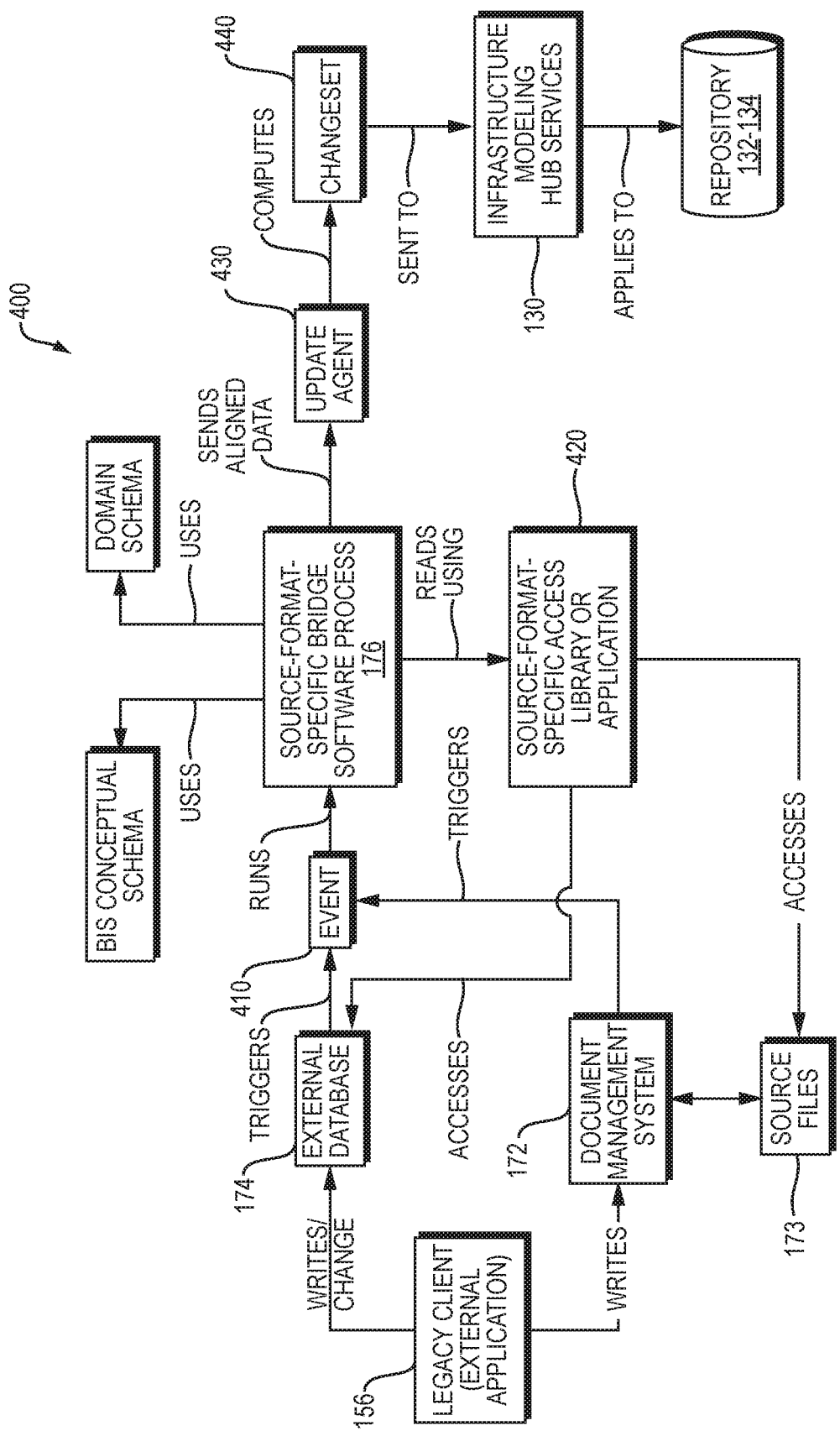
FIG. 4 is a flow diagram showing an example sequence of operations executed by software processes to align source infrastructure data to be compatible with a conceptual schema (e.g., BIS), and write the data to one or more briefcases that utilize an underlying database schema (e.g., DgnDb).

FIG. 4 is a flow diagram showing an example sequence of operations executed by software processes to align source infrastructure data to be compatible with a conceptual schema (e.g., BIS), and write the data to one or more briefcases 152 that utilize an underlying database schema (e.g., DgnDb). Initially, a legacy client (i.e. external application) 156 changes data maintained according to its source format, by writing to a document management system 172 that changes a source file 173 or by writing/changing an external database 174. The source format may have no explicit schema, or its schema may be implicit in the legacy client's code. The document management system 172 or external database 174 may trigger an event 410 in response to the changes. The event 410 causes a source-format-specific bridge software process 176 to run. As mentioned above, there may be a plurality of different bridge software processes 176, each tailored to different respective source formats, and each one may be executed independently when needed (potentially in parallel).

The triggered bridge software process 176 may support incremental alignment, such that when run it initiates a sequence of operations that align source data that has changed since a last alignment, but does not affect source data that has been maintained constant. In one embodiment, change detection is enabled by a synchronization information record that maintains condition information as of a last successful alignment. The synchronization information record may enable incremental alignment even when the document management system 172 and file 173, or external database 174, has limited capabilities (e.g., is simply able to enumerate its contents, rather than identify specific changed contents since a last successful alignment).

The triggered bridge software process 176 accesses at least the changed source data from the file 173 of the document management system 172 or external database 174 using a source-format-specific access library or application 420. Such library or application may follow reading conventions of the source format. The bridge software process 176 understands the meaning of the source data and how to express it in terms of the conceptual schema (e.g., BIS). The bridge software process 176 may further understand how to utilize a relevant domain schema of the conceptual schema so that source data can be transformed to inhabit appropriate classes and data types for the set of subject matter for which it pertains.

To that end, the triggered bridge software process 176 performs alignment operations to conform the changed source data to the conceptual schema and a relevant domain schema. The alignment may include a number of sub operations. For example, elements, models and aspects may be generated to express the changed source data. Types of the elements and models may be chosen so that the changed source data is unambiguously classified as associated with modeling perspectives (e.g., physical, analytical, informational, etc.). Role elements may be generated that describe the usage of the changed source data in the overall infrastructure description. Further, relationships may be created that relate the generated elements, aspects or models among themselves, and to existing elements, aspects or models. High-level organizational structures, such as subjects, may be defined. Spatial data from a source coordinate system may be transformed into a spatial coordinate system used by the conceptual and unit labels may be transformed from a source unit system into a unit system used by the conceptual schema.

In order to conduct the alignment operations, the triggered bridge software process 176 may produce schema mappings that relate the source data format to the conceptual schema, and a domain schema thereof. Further, the triggered bridge software process 176 may plan spatial transforms and unit system transforms. The schema mappings and spatial/unit system transforms may be generated upon an initial alignment of source data from the source format to be compliant with the conceptual schema and the domain schema, and may be subsequently accessed and utilized when changes to the source data require subsequent incremental alignment.

While the triggered bridge software process 176 is responsible for detecting changes, reading at least changed source data and aligning the changed source data to be compliant with the conceptual schema (e.g., BIS) and the domain schema, it may not be concerned with the underlying database schema. To that end, the triggered bridge software process 176 may send aligned data to an update agent 430. The update agent 430 may take the form of a web service called remotely by the bridge software process 176 or, alternatively, a library that may be combined with and called directly by the bridge software process 176. The update agent 430 may interpret the aligned data and compute a changeset (e.g., a SQLite changeset) 440 therefrom, which can be applied to a briefcase to transition it from a prior state to a new one, utilizing the conventions of the database schema (e.g., DgnDb). In one embodiment, the update agent 430 computes the changeset 440 by writing data to a private copy of a briefcase with change-detection functionality turned on. Writing data may entail executing a sequence of database modification commands, such as inserts, updates, and deletes of rows, etc. Writing data may also entail modifying the structure of a briefcase itself, such as inserting new tables, or inserting new columns into existing tables. The change-detection functionality records the actual and specific effects of the modification commands on the private copy, accumulating a record of these effects. The record is then saved in the form of a changeset 440 that can be used to recreate the changes.

The changeset 440 may be sent to the infrastructure modeling hub services (e.g., iModelHub services) 130 (e.g., iModelHub service) which may store it for eventual application to a briefcase 152 to update it to a new version. Such updating may reconcile the infrastructure description used by clients 150, 154 (e.g., for visualization, analysis, etc.) with the infrastructure description used by the legacy clients 156, so they will all see the same infrastructure information.

In conclusion, the above description details techniques for alignment of source infrastructure data to be compatible with a conceptual schema (e.g., BIS). The conceptual schema may serve as a "digital twin" of real-world infrastructure, with physical information serving as a "backbone" and non-physical information (e.g., analytical information, functional information, informational information etc.) maintained relative thereto, forming a cohesive whole, while avoiding unwanted data redundancies. It should be understood that data redundancies can consume excessive storage space (i.e., introduce storage inefficiencies) and consume extra processing power to separately access and manipulate (i.e., introduce processing inefficiencies). Among other benefits, the techniques described above may improve the functioning of both client device and cloud computing device by reducing such storage and processing inefficiencies, to improve the functioning of such electronic devices.

It should be understood that a wide variety of adaptations and modifications may be made to the techniques. For example, while it is described above that the conceptual schema (e.g., BIS) is implemented through a single underlying database schema (e.g., DgnDb), it should be understood that in alternative embodiments the conceptual schema may be implemented in multiple underlying data formats. For example, individual bridge software processes 176 may be configured to align data to different "focused" underlying schemas.

In general, it should be remembered that functionality may be implemented in software, hardware or various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A method of aligning source infrastructure data to be compatible with a conceptual schema that provides a unified digital description of real-world infrastructure, comprising:
    detecting source data of an infrastructure description in one or more external databases or source files has changed since a last alignment;
    in response to the detecting, reading at least the changed source data by a source-format-specific bridge software process executing on one or more electronic devices;
    aligning, by the bridge software process, the changed source data with the conceptual schema to produce a description compliant with the conceptual schema, the aligning to use one or more schema mappings;
    determining, by an update agent executing on the one or more electronic devices, effects of the produced description on a private copy of a database maintained according to an underlying database schema of the conceptual schema and producing therefrom a changeset that recreates the effects;
    storing the changeset for eventual application to a particular instance of the database maintained according to the underlying database schema of the conceptual schema to update an infrastructure description therein, by modifying tables of the particular instance of the database or the structure of the particular instance of the database; and
    outputting database entries from the particular instance of the database to a client, the client usable to at least display a visualization of the updated infrastructure description to a user.

2. The method of claim 1, wherein the bridge software process is one of a plurality of different source-format-specific bridge software processes each related to a specific legacy client of a specific product, discipline, or phase that uses source data in one or more associated external databases or source files.

3. The method of claim 1, wherein the conceptual schema is structured as a family of hierarchically layered domains, and the aligning aligns the changed source data to produce data according to a domain schema of the conceptual schema.

4. The method of claim 1, wherein the conceptual schema describes infrastructure as a set of elements, aspects, models and relationships.

5. The method of claim 1, wherein the reading further comprises accessing at least the changed source data by a source-format-specific access library or application executing on the one or more electronic devices.

6. The method of claim 1, wherein the detecting further comprises:
    receiving an event triggered by the external databases or a document management system that maintains the source files.

7. The method of claim 1, wherein the aligning comprises at least one of:
    generating elements, models and aspects that express the changed source data;
    choosing types of elements and models that classify the changed source data as associated with modeling perspectives;

generating role elements that describe usage of the changed source data;

creating relationships which relate elements, models and aspects for the changed source data to themselves or existing elements, models and aspects;

transforming spatial data from a source coordinate system into a spatial coordinate system used by the conceptual schema; or transforming unit labels from a source unit system into a unit system used by the conceptual schema.

8. The method of claim 1, wherein the determining effects and producing therefrom the changeset comprises:

writing data to the private copy with change-detection functionality turned on to record effects of modification commands on the private copy;

accumulating a record of the recorded effects; and saving the record in a form of the changeset.

9. The method of claim 1, wherein the particular instance of the database is a constituent instance of a distributed database maintained by cloud-based infrastructure modeling hub services software.

10. The method of claim 1, wherein the update agent is a web service that is called remotely by the bridge software process.

11. The method of claim 1, wherein the update agent is a local library used by the bridge software process.

12. A system for aligning source infrastructure data to be compatible with a conceptual schema that provides a unified digital description of real-world infrastructure, comprising:

a legacy client executing on a first computing device, the legacy client configured to utilize one or more databases or source files according to a source format;

a client executing on a second computing device, the client including a user interface; and a source-format-specific bridge software process executing on one or more cloud computing devices configured to detect a change since a last alignment to source data in the one or more external databases or source files utilized by the legacy client, and in response to the detection, read at least the changed source data and align the changed source data with the conceptual schema to produce a description compliant with the conceptual schema;

an update agent executing on one or more cloud computing devices configured to determine effects of the produced description on a private copy of a database maintained according to an underlying database schema of the conceptual schema and produce therefrom a changeset that recreates the effects;

infrastructure modeling hub services software executing on the one or more cloud computing devices configured to store the changeset for eventual application to a particular instance of the database maintained according to the underlying database schema of the conceptual schema to update an infrastructure description therein, wherein the client is configured to output database entries from the particular instance of the database, such that the legacy client and the client see a same infrastructure description.

13. The system of claim 12, wherein the bridge software process is one of a plurality of different source-format-specific bridge software processes each related to a specific legacy client of a specific product, discipline, or phase that uses source data in one or more associated external databases or source files.

14. The system of claim 12, wherein the conceptual schema is structured as a family of hierarchically layered domains, and the bridge software process is configured to align the changed source data to produce data according to a domain schema of the conceptual schema.

15. The system of claim 12, wherein the conceptual schema describes infrastructure as a set of elements, aspects, models and relationships.

16. The system of claim 12, wherein the alignment comprises at least one of:

generating elements, models and aspects that express the changed source data;

choosing types of elements and models that classify the changed source data as associated with modeling perspectives;

generating role elements that describe usage of the changed source data;

creating relationships which relate elements, models and aspects for the changed source data to themselves or existing elements, models and aspects;

transforming spatial data from a source coordinate system into a spatial coordinate system used by the conceptual schema; or transforming unit labels from a source unit system into a unit system used by the conceptual schema.

17. A non-transitory computer readable medium having software encoded thereon for aligning source infrastructure data to be compatible with a conceptual schema that provides a unified digital description of real-world infrastructure, the software when executed by one or more computing devices operable to:

detect source data of an infrastructure description in one or more external databases or source files has changed since a last alignment;

read at least the changed source data by a source-format-specific bridge software process;

align the changed source data with the conceptual schema to produce a description compliant with the conceptual schema;

produce a changeset that recreates effects of the produced description by determining effects of the produced description on a private copy of a database maintained according to an underlying database schema of the conceptual schema;

store the changeset for eventual application to a particular instance of a database maintained according to an underlying database schema of the conceptual schema to update an infrastructure description therein; and display a visualization of the updated infrastructure description to a user.

18. The non-transitory computer readable medium of claim 17, wherein the bridge software process is one of a plurality of different source-format-specific bridge software processes each related to a specific legacy client of a specific product, discipline, or phase that uses source data in one or more associated external databases or source files.

19. The non-transitory computer readable medium of claim 17, wherein the conceptual schema is structured as a family of hierarchically layered domains, and the software to align is operable to produce data according to a domain schema of the conceptual schema.

20. The non-transitory computer readable medium of claim 17, wherein the conceptual schema describes infrastructure as a set of elements, aspects, models and relationships.

* * * * *

UNITED STATES PATENT AND TRADEMARK OFFICE
CERTIFICATE OF CORRECTION

PATENT NO. : 11,392,559 B2
APPLICATION NO. : 16/156887
DATED : July 19, 2022
INVENTOR(S) : Keith A. Bentley et al.

It is certified that error appears in the above-identified patent and that said Letters Patent is hereby corrected as shown below:

In the Specification

Column 8, Line 3:
other then from the single element that owns it. In one
Should read as follows:
other than from the single element that owns it. In one Column 8, Line 49:
subject. An analytical model may represents an analytical
Should read as follows:
subject. An analytical model may represent an analyti- In the Claims Claim 17:
Column 14, Line 46:
instance of a database maintained according to an
Should read as follows:
instance of the database maintained according to an Signed and Sealed this
Sixteenth Day of July, 2024

Katherine Kelly Vidal
*Director of the United States Patent and Trademark Office*